(12) United States Patent
Shigenaka et al.

(10) Patent No.: US 6,465,860 B2
(45) Date of Patent: *Oct. 15, 2002

(54) MULTI-WAVELENGTH SEMICONDUCTOR IMAGE SENSOR AND METHOD OF MANUFACTURING THE SAME

(75) Inventors: Keitaro Shigenaka, Hachioji (JP); Fumio Nakata, Urayasu (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/386,294

(22) Filed: Aug. 31, 1999

(65) Prior Publication Data

US 2002/0135034 A1 Sep. 26, 2002

(30) Foreign Application Priority Data

Sep. 1, 1998 (JP) .......................... 10-247347

(51) Int. Cl.$^7$ .......................... H01L 31/0296; G01J 5/20
(52) U.S. Cl. ....................... 257/442; 257/188; 257/440; 250/370.13; 250/370.14; 250/338.4; 250/339.02
(58) Field of Search ................. 257/440–442, 257/184, 188; 250/338.4, 339.02, 370.13, 370.14

(56) References Cited

U.S. PATENT DOCUMENTS

| | | | | |
|---|---|---|---|---|
| 5,010,381 A | * | 4/1991 | Shiba | 257/188 |
| 5,113,076 A | | 5/1992 | Schulte | 257/184 |
| 5,149,956 A | | 9/1992 | Norton | |
| 5,185,648 A | * | 2/1993 | Baker et al. | 257/441 |
| 5,380,669 A | * | 1/1995 | Norton | 257/440 |
| 5,559,336 A | * | 9/1996 | Kosai et al. | 257/188 |
| 5,581,084 A | * | 12/1996 | Chapman et al. | 250/338.4 |
| 5,583,338 A | * | 12/1996 | Goodwin | 250/338.4 |
| 5,751,005 A | * | 5/1998 | Wyles et al. | 257/440 |
| 6,034,407 A | * | 3/2000 | Tennant et al. | 257/440 |

* cited by examiner

Primary Examiner—Gene M. Munson
(74) Attorney, Agent, or Firm—Oblon, Spivak, McClelland, Maier & Neustadt, P.C.

(57) ABSTRACT

A multi-wavelength semiconductor image sensor comprises a p-type $Hg_{0.7}Cd_{0.3}Te$ photo-absorbing layer formed on a single crystal CdZnTe substrate, a CdTe isolation layer deposited on the photo-absorbing layer, a p-type $Hg_{0.7}Cd_{0.23}Te$ photo-absorbing layer deposited on the CdTe isolation layer, $n^+$ regions which are formed in these photo-absorbing layers and form a pn-junction with each of these photo-absorbing layers, an indium electrode connected to each of these $n^+$ regions and a ground electrode connected to the photo-absorbing layer, the semiconductor isolation layer being electrically isolated from the photo-absorbing layer.

11 Claims, 6 Drawing Sheets

MULTI-WAVELENGTH SEMICONDUCTOR IMAGE SENSOR AND METHOD OF MANUFACTURING THE SAME

BACKGROUND OF THE INVENTION

The present invention relates to a multi-wavelength semiconductor image sensor having sensitivity to infrared with plural wavelengths and also to a method of manufacturing the image sensor.

In multi-wavelength semiconductor image sensors, many photodetector elements made of, for example, photodiodes are arranged in the form of a matrix on a semiconductor substrate. As each photodetector element senses plural wavelengths, it has a structure corresponding to each wavelength.

As conventionally typical infrared image sensors using $Hg_{1-x}Cd_xTe$ and having sensitivity to plural wavelengths, there is a multi-wavelength semiconductor image sensor having a mesa structure which is disclosed in U.S. Pat. No. 5,113,076 (Santa Barbara Research Center, USA, May 12, 1992). In this image sensor, if light is received from an n-type $Hg_{0.7}Cd_{0.3}Te$ layer, a middle wavelength infrared is detected by a carrier produced in the vicinity of the reverse-biased junction between the n-type $Hg_{0.7}Cd_{0.3}Te$ layer and a p-type $Hg_{0.6}Cd_{0.4}Te$ layer whereas a long wavelength infrared is detected by a carrier produced in the vicinity of the reverse-biased junction between the p-type $Hg_{0.6}Cd_{0.4}Te$ layer and an n-type $Hg_{0.8}Cd_{0.2}Te$ layer.

Because this image sensor has a mesa structure, the fill factor of the indium doped n-type $Hg_{0.8}Cd_{0.2}Te$ layer which is the second photo-absorbing layer is smaller than that of the indium doped n-type $Hg_{0.7}Cd_{0.3}Te$ layer which is the first photo-absorbing layer. Therefore, only insufficient sensitivity to the wavelength corresponding to the n-type $Hg_{0.8}Cd_{0.2}Te$ layer which is the second photo-absorbing layer is obtained.

Also, because a circuit which switches bias voltage to apply the voltage to a diode is required to select a wavelength band, there is the problem that a charge transfer device cannot be used by connecting it to the output.

In the image sensor disclosed in U.S. Pat. No. 5,149,956 (Santa Barbara Research Center, USA, Sep. 22, 1992), two photodiodes form one pixel which is provided with two interconnecting bumps. Because of this, it is difficult to reduce the area per one pixel and hence the pixel density cannot be improved.

While, in a multi-wavelength semiconductor detector disclosed in EP-A-0475525 (Philips Electronics and Associated Industries Limited, GB, Mar. 18, 1992), it is necessary that semiconductor layers which differ in the forbidden gap are thinned to tens of micron meters by a semiconductor layer polishing process and an etching process and then bonded with each other to form a laminated layer using an adhesive, bringing about remarkable production difficulty.

Also, two connecting electrodes per one pixel are required to draw a charge from a photo-absorbing layer, rendering high density integration difficult.

Moreover, because an isolation groove is formed in a photo-absorbing layer, the fill factor of the photo-absorbing layer which receives a long wavelength infrared is reduced with respect to a photo-absorbing layer which receives a middle wavelength infrared and hence only insufficient sensitivity can be obtained.

As stated above, as to conventional two-dimensional infrared image sensors using a compound semiconductor and having sensitivity to plural wavelengths, those having a structure suitable to high density integration have not been realized. Also its production process is complicated so that the objective sensor can be completed with difficulty.

BRIEF SUMMARY OF THE INVENTION

It is an object of the present invention to provide a multi-wavelength semiconductor image sensor which enables high-density integration and can be made in a simplified process. It is another object of the present invention to provide a method of manufacturing the image sensor.

According to a first aspect of the present invention, there is provided a multi-wavelength semiconductor image sensor comprising a laminated structure having plural first conductive type semiconductor photo-absorbing layers which differ from each other in a forbidden gap and are formed on a substrate and a semiconductor isolation layer interposed between the first conductive type semiconductor photo-absorbing layers; a second conductive type region which is formed continuously in each of the first conductive type semiconductor photo-absorbing layers of the laminated structure and forms a pn-junction with the first conductive type semiconductor photo-absorbing layer; an output electrode connected to each of the second conductive type regions; and plural ground electrodes which are connected respectively to each of the first conductive type semiconductor photo-absorbing layers.

According to another aspect of the present invention, there is provided a multi-wavelength semiconductor image sensor comprising a first conductive type-first semiconductor photo-absorbing layer with a first forbidden gap which is formed on a substrate; a semiconductor isolation layer grown on the first semiconductor photo-absorbing layer; a first conductive type-second semiconductor photo-absorbing layer with a second forbidden gap differing from the first forbidden gap, the second semiconductor photo-absorbing layer being grown on the semiconductor isolation layer; plural second conductive type regions which are formed continuously in the first and second semiconductor photo-absorbing layers and forms a pn-junction with each of the first conductive type-first and second semiconductor photo-absorbing layers; an output electrode connected to each of the plural second conductive type regions; and a ground electrode connected to each of the first conductive type-first and second semiconductor photo-absorbing layers.

In the multi-wavelength semiconductor image sensor of the present invention, the forbidden gap of the semiconductor isolation layer is designed to be larger than any one of the forbidden gaps of the plural first conductive type semiconductor photo-absorbing layers with different forbidden gaps. Also, each surface of the second conductive type regions has a concave form. Impurities can be diffused to the deep position accordingly.

In the multi-wavelength semiconductor image sensor of the present invention, preferably a compound semiconductor including mercury is used for each of the first and second semiconductor photo-absorbing layers.

According to a further aspect of the present invention, there is provided a method of manufacturing a multi-wavelength semiconductor image sensor comprising a step of depositing a first conductive type-first semiconductor photo-absorbing layer with a first forbidden gap on a substrate; a step of depositing a semiconductor isolation layer, which is electrically isolated from the first semiconductor photo-absorbing layer, on the first semiconductor photo-absorbing layer; a step of etching the surface of the semiconductor isolation layer to form an opening portion; a step of introducing an impurity into the opening to form a second conductive type region; a step of depositing the next first conductive type semiconductor photo-absorbing layer with a forbidden gap differing from the first forbidden gap on the semiconductor isolation layer including the second conductive type region, a step of repeating the step of depositing the isolation layer, the step of forming the opening in the isolation layer and the step of forming the second conductive type region until the number of the laminated layers reaches a prescribed value; a step of forming an output electrode on the upper surface of the second conductive type region formed on the most upper semiconductor photo-absorbing layer; and a step of forming a ground electrode in each of the laminated first conductive type region as each semiconductor photo-absorbing layer.

According to a still further aspect of the present invention, there is provided a method of manufacturing a multi-wavelength semiconductor image sensor comprising a step of depositing a first conductive type semiconductor photo-absorbing layer with a first forbidden gap on a substrate; a step of depositing a semiconductor isolation layer, which is electrically isolated from the semiconductor photo-absorbing layer, on the semiconductor photo-absorbing layer; a step of etching the surface of the semiconductor isolation layer to form an opening portion; a step of depositing the next first conductive type semiconductor photo-absorbing layer with a forbidden gap differing from the first forbidden gap on the semiconductor isolation layer, a step of repeating the step of depositing the isolation layer, the step of forming the opening in the isolation layer and the step of depositing the next first conductive type semiconductor photo-absorbing layer with a different forbidden gap until the number of the laminated semiconductor photo-absorbing layers reaches a prescribed value; a step of introducing an impurity into the opening to form a second conductive type region penetrating each of the semiconductor photo-absorbing layers; a step of forming an output electrode on the upper surface of the second conductive type region; and a step of forming a ground electrode in each of the first conductive type semiconductor photo-absorbing layer.

According to a still further aspect of the present invention, there is provided a multi-wavelength semiconductor image sensor comprising photodiodes disposed at each position of pixels and sensing each of different wavelength regions; a first switching element to which each anode of the photodiodes disposed at each position of the pixels is connected in common; and a second switching element to which each cathode of photodiodes corresponding to the positions of plural pixels and sensing the same wavelength region every different wavelength region is connected in common. According to this multi-wavelength semiconductor image sensor, the pixels and wavelength regions can be optionally selected by switching these switching elements.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be hereinafter explained with reference to the drawings.

Figure 1:
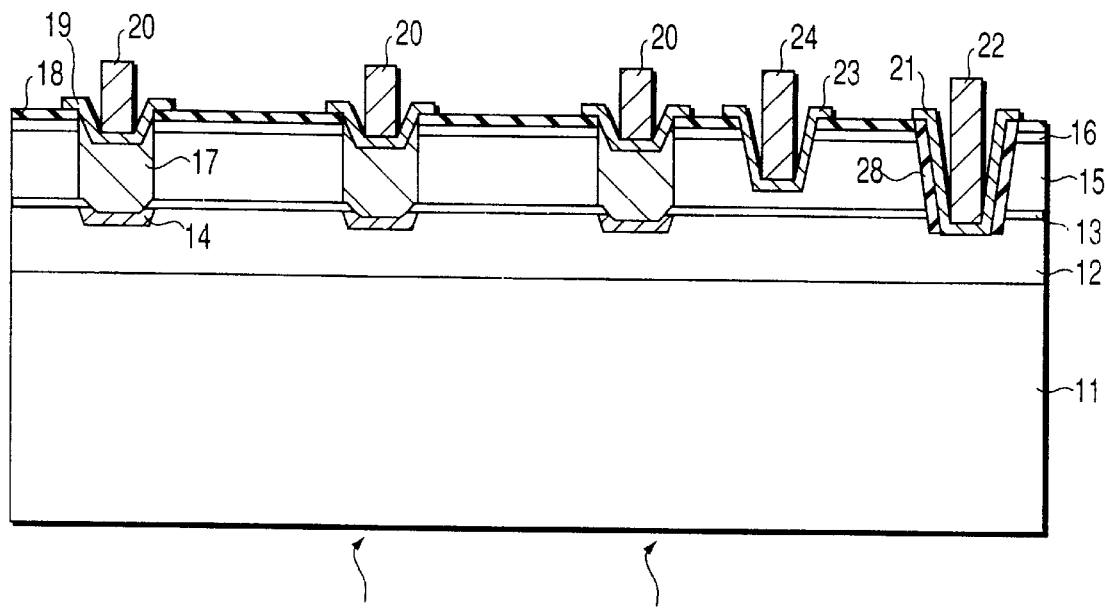
FIG. 1 is a sectional view and perspective view of a multi-wavelength semiconductor image sensor according to a first embodiment of the present invention.
Figure 2:
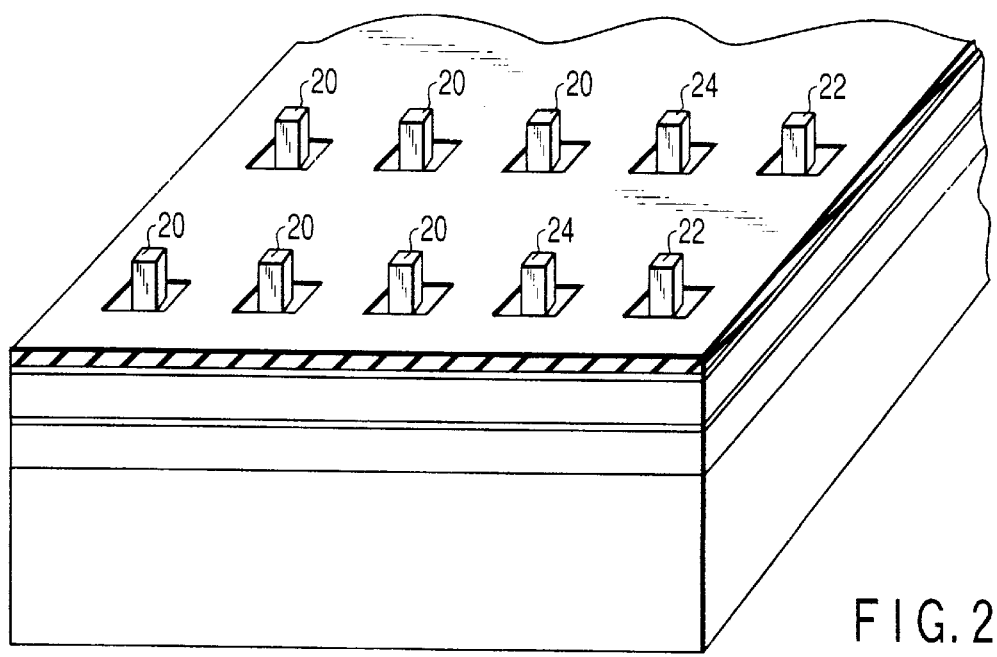
FIG. 2 is a perspective view of the multi-wavelength semiconductor image sensor of FIG. 1.

Firstly, the structure of a first embodiment will be explained. As shown in FIGS. 1 and 2, plural photodiodes as photodetector elements are arranged in a matrix form on a substrate 11 of single crystal CdZnTe (Zn:3%). To state in detail, on the substrate 11, a p-type $Hg_{0.7}Cd_{0.3}Te$ photo-absorbing layer 12 for an MWIR for instance which has a first forbidden gap is formed. On the p-type $Hg_{0.7}Cd_{0.3}Te$ photo-absorbing layer 12, a CdTe isolation layer 13 is formed.

An $n^+$ region 14 is formed at the position of each pixel in the p-type $Hg_{0.7}Cd_{0.3}Te$ photo-absorbing layer 12. On the CdTe isolation layer 13, a p-type $Hg_{0.77}Cd_{0.23}Te$ photo-absorbing layer 15 for an LWIR (Long Wavelength Infrared) which has a second forbidden gap is formed and on the p-type $Hg_{0.77}Cd_{0.23}Te$ photo-absorbing layer 15, a CdTe passivation layer 16 and a zinc sulfide thin film 18 as a passivation film are formed.

An $n^+$ region 17 of $Hg_{0.77}Cd_{0.23}Te$ is formed on the $n^+$ region 14 in the p-type $Hg_{0.77}Cd_{0.23}Te$ photo-absorbing layer 15 and an indium electrode 19 is formed on the $n^+$ region 17. Ground electrodes 21, 23 common to the photo-absorbing layers 12, 15 with respective wavelengths are formed on the periphery of the sensor array. Among these, the electrode 21 is insulated from the photo-absorbing layer 15 by an insulation film 28. A interconnecting bump 20 made of, for instance, indium is formed on each electrode 19 of all elements. Also, interconnecting bumps 22, 24 are formed on the common ground electrodes 21, 23 corresponding to respective wavelengths. A charge transfer device, though not shown, is electrically connected to these interconnecting bumps 20, 22, 24. As a consequence, as shown in FIG. 2, a multi-wavelength image sensor in which plural multi-wavelength photodetector elements are arranged in a matrix form is formed.

Figure 3A:
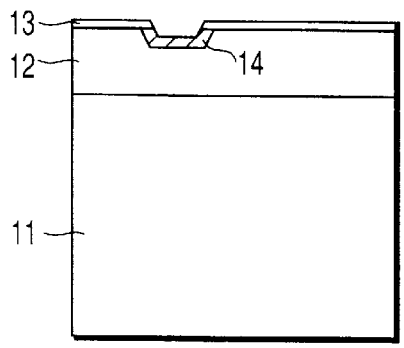
FIGS. 3A, 3B and 3C are sectional views of a device structure in the step of manufacturing the multi-wavelength semiconductor image sensor shown in FIGS. 1 and 2.

Here, a method of manufacturing the multi-wavelength semiconductor image sensor as shown in FIGS. 1 and 2 will be explained. As shown in FIG. 3A, the p-type $Hg_{0.7}Cd_{0.3}Te$ photo-absorbing layer 12 for an MWIR is deposited in a thickness of about 10 μm on the substrate 11 of single crystal CdZnTe (Zn:3%) by a metal organic chemical vapor deposition method using an organic compound as source material. As for the deposition condition, metal mercury, dimethyl cadmium and diisopropyl telluride are used as raw gas and the growth temperature is designed to be, for example, 360° C. In succession, the CdTe isolation layer 13 about 2 μm in thickness is formed on the p-type $Hg_{0.7}Cd_{0.3}Te$ photo-absorbing layer 12 at a growth temperature of 320° C. At the position of each pixel, the CdTe isolation layer 13 and the photo-absorbing layer 12 lying underneath are removed in a square shape with a side length of 10 μm by etching to a depth of about 3 μm from the surface of the isolation layer 13 to the photo-absorbing layer 12 according to a photography technique. Then, for example, a boron ion as a donor impurity is introduced at a dose of $1\times10^{14}$ $cm^{-3}$ and an acceleration voltage of 150 keV and indium is diffused to form the $n^+$ region 14.

Figure 3B:
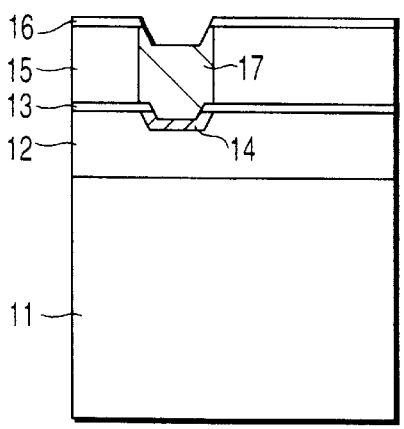

Next, as shown in FIG. 3B, the supply amount of raw material is changed to grow the p-type $Hg_{0.77}Cd_{0.23}Te$ photo-absorbing layer 15 about 10 μm in thickness on the exposed portion of the isolation layer 13 and photo-absorbing layer 12 at a growth temperature of 360° C. for an LWIR by using metal mercury, dimethyl cadmium and diisopropyl telluride. In this case, the growth temperature is designed to be 320° C. at the start of growth and then raised up to 360° C. in about two minutes. This operation can prevent the dissociation of mercury from the $n^+$ region 14 of $Hg_{0.7}Cd_{0.3}Te$ and the p-type $Hg_{0.7}Cd_{0.3}Te$ photo-absorbing layer 12. In succession, the CdTe passivation layer 16 about 2 μm in thickness is grown on the photo-absorbing layer 15 at a growth temperature of 320° C.

Next, using a photolithography technique, the passivation layer 16 and the photo-absorbing layer 15 are removed in a square shape with a side length of 10 μm by etching to a depth of about 3 μm from the surface of the passivation layer 16 to the photo-absorbing layer 15. Then, for example, a boron ion as a donor impurity is introduced at a dose of $1\times10^{14}$ $cm^{-3}$ and an acceleration voltage of 150 kev and indium is diffused to form the $n^+$ region 17 of $Hg_{0.77}Cd_{0.23}Te$ which connects to the $n^+$ region 14.

Figure 3C:
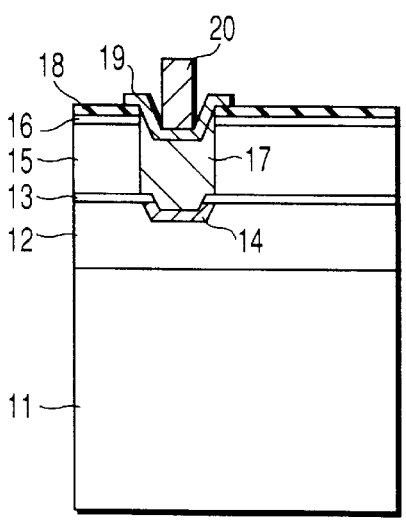

After that, as shown in FIG. 3C, the zinc sulfide thin film 18 with a thickness of 300 nm is laminated as a passivation layer on the passivation layer 16 and the $n^+$ region 17 of $Hg_{0.77}Cd_{0.23}Te$. Then the zinc sulfide thin film 18 is selectively etched to expose the $n^+$ region 17 of $Hg_{0.77}Cd_{0.23}Te$. Thereafter, the indium electrode 19 is formed on the exposed portion of the $n^+$ region 17 of $Hg_{0.77}Cd_{20.3}Te$ and the indium interconnecting bump 20 is provided on the electrode 19.

When layers with different forbidden gaps are laminated, these layers are arranged so that the forbidden gaps become narrower in order from the direction of incidence of infrared to thereby absorb infrared conforming to the forbidden gap in each layer in a more efficient manner. Therefore, in the image sensor shown in FIGS. 1 and 2, the forbidden gap of each photo-absorbing layer becomes narrower in order in the direction of incidence of infrared introduced from the substrate 11 of single crystal CdZnTe. In addition, the semiconductor isolation layer 13 is formed of a semiconductor layer with a forbidden gap wider than all of the forbidden gaps of the first conductive type semiconductor photo-absorbing layers 12 and 15.

More specifically, when the photodetector layer of HgCdTe is formed by a MOCVD method, the components of the photodetector layer are determined by the following rule:

Assuming content ratio of Cd in the HgCdTe crystal as x and supply amount of cadmium source material (DMCd) as y, the supply amount of cadmium source material is determined by the following equation:

$$x = \frac{\exp(-3 + 9 \times 10^4 y)}{\exp(-3 + 9 \times 10^4 y) + 3 - 55 \times 10^4 y}$$

where deposition temperature is 360° C.
In this time, the supply amount of mercury and that of telluride source material (DIPTe) are a constant value of $4.7\times10^{-4}$ mol/min, $1.0\times10^{-4}$ mol/min. For example, When a LWIR photodetector layer of x=0.23 is formed, the supply amount of DMCd is $2.53\times10^{-5}$ mol/min. When a MWIR photodetector layer of x=0.30 is formed, the supply amount of DMCd is $2.8\times10^{-5}$ mol/min. When a SWIR photodetector layer of x=0.80 is formed, the supply amount of DMCd is $4.33\times10^{-5}$ mol/min. However, the relationship between the supply amount of source material and the composite ratio of Cd compound crystal varies in accordance with the deposition temperature and the deposition machine.

Figure 4:
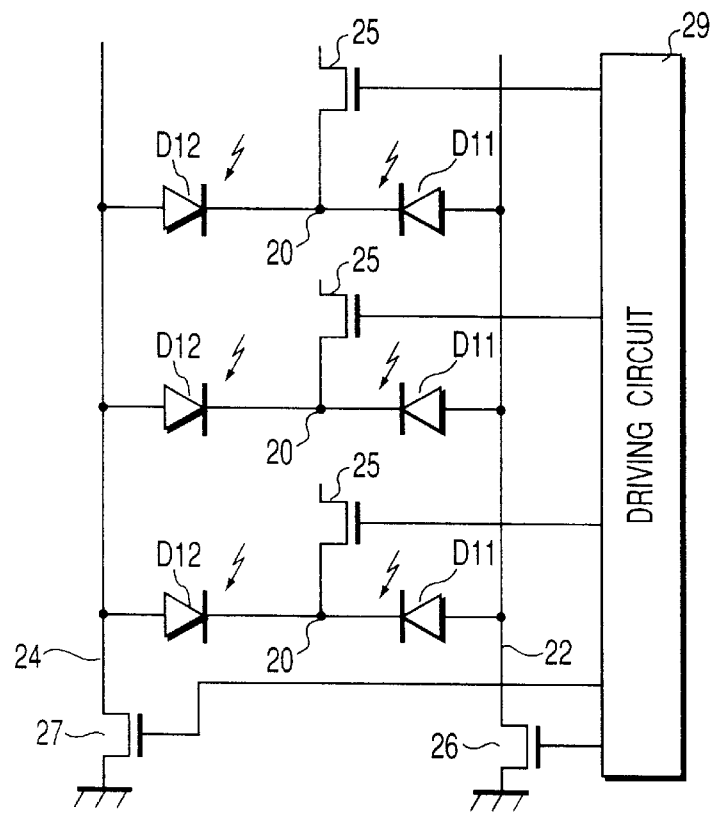
FIG. 4 is an equivalent circuit diagram of the multi-wavelength semiconductor image sensor according to the first embodiment of the present invention.

FIG. 4 shows an equivalent circuit of the image sensor shown in FIGS. 1 and 2. The p-type $Hg_{0.7}Cd_{0.3}Te$ photo-absorbing layer 12 and the $n^+$ region 14 of $Hg_{0.7}Cd_{0.3}Te$ constitute a photodiode D11 and the p-type $Hg_{0.77}Cd_{0.23}Te$ photo-absorbing layer 15 and the $n^+$ region 17 of $Hg_{0.77}Cd_{0.23}Te$ constitute a photodiode D12. The cathodes of two photodiodes D11 and D12 are formed of these $n^+$ regions 14 and 17. These $n^+$ regions 14 and 17 are connected in common to the electrode 19 and the interconnecting bump 20. Each interconnecting bump 20 is connected to the input terminal of a charge transfer device via the switching element 25. The anode of each photodiode D11 is connected to the ground electrode 21 and the interconnecting bump 22 and the anode of each photodiode D12 is connected to the ground electrode 23 and the interconnecting bump 24. These interconnecting bumps 22 and 24 are grounded via the switching elements 26 and 27 respectively. For instance, when the photodiode D11 is used to detect infrared, the switching element 26 is turned on according to a driving signal from a driving circuit 29 and at the same time the switching element 25 is turned on to ground the photo-absorbing layer having the first forbidden gap. Hence a photoelectric signal produced in the photodiode D11 can be transferred to a charge transfer device via the switching element 25. At this time, the output signal, namely, photo-electric signal of the photodiode D12 is not transferred to a charge transfer device via the switching element 25 because the switching element 27 is off and hence the photo-absorbing layer is not grounded. On the other hand, when the photodiode D12 is used to detect infrared, the switching element 26 is turned off and the switching elements 27 and 25 are tuned on, whereby the photoelectric signal of the photodiode D12 can be transferred to a charge transfer device via the switching element 25.

The switching control of the above switching elements 25 to 27 will be hereinafter explained in detail with reference to the timing charts shown in FIGS. 5B to 5D.

Figure 5A:
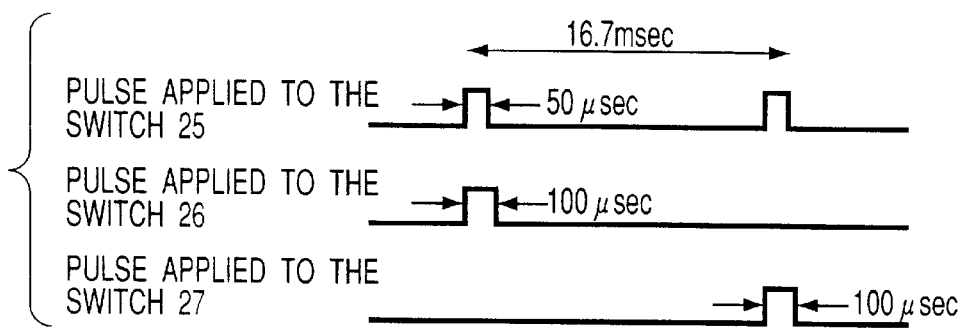
FIGS. 5A to 5C are views showing a timing chart for driving the circuit shown in FIG. 4.

In the circuit shown in FIG. 4, when a 50 μsec pulse is applied to the switching element 25 every 16.7 msec and an 100 μsec pulse as shown in FIG. 5A is applied to the switching element 26 or 27 from the driving circuit 29, an output signal of a first wavelength of a first frame corresponding to the diode D11 and an output signal of a second wavelength of a second frame corresponding to the diode D12 are selectively obtained. Specifically, by switching the switching elements 26 and 27, image signals of the first and second wavelengths are selectively obtained. For instance, in the case where a disturbance caused by a high temperature material is raised when the switching element 26 is turned on and a target is picked up in an image of a 3 to 5 μm (MWIR) band with high executive sensitivity, the detecting wavelength can be switched to an 8 to 12 μm (LWIR) band by turning off the switching element 26 and turning on the switching element 27 when the frame is renewed. Problems such as halation caused by the pickup of a high temperature material are not posed and hence the shape of the target can be exactly determined and the line can be well-corrected.

Figure 5B:
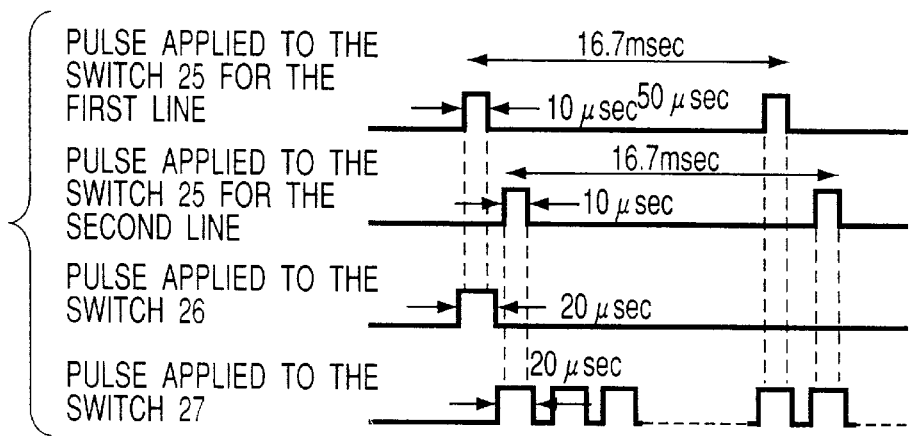

Also, as shown in FIG. 5B, when, with respect to first and second lines, a 10 μsec pulse is applied to the switching element 25 every 16.7 msec and a 20 μsec pulse is applied to the switching element 26 or 27, an output signal of a first wavelength of the first line and the next output signal of a second wavelength of the second line are selectively obtained. Specifically, by switching the switching elements 26, 27, line signals of the first and second wavelengths are selectively obtained. For instance, when using the sensor of the present invention as an inspection camera and taking a picture of a zone in which high temperature substance is always present in the background, the switching 27 is turned on in the line on which the zone is imaged to inspect using a detecting wavelength of 8 to 12 μm (LWIR) whereas a zone in which a low temperature substance is present in the background can be inspected using 3 to 5 μm (MWIR) band with high executive sensitivity by turning off the switching element 27 and turning on the switching element 26.

Figure 5C:
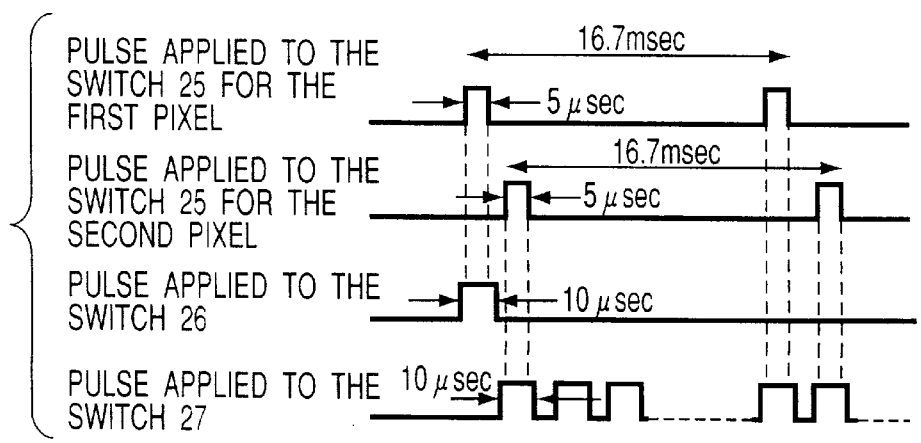

Further, as shown in FIG. 5C, when, with respect to first and second pixels, a 5 μsec pulse is applied to the switching element 25 every 16.7 msec and a pulse is applied to the switching element 26 or 27, an output signal of a first wavelength of the first pixel and the next output signal of a second wavelength of the second pixel are selectively obtained. Specifically, by switching the switching elements 26 and 27, pixel signals of the first and second wavelengths are obtained. This enables the detecting wavelength to be changed every pixel. A detecting wavelength of 8 to 12 μm band is likewise used only for a zone in which a high temperature substance is present in the background whereby the material-recognition rate can be improved.

A device having the above structure was measured for the diode characteristics of each pixel in such a condition as cooled at the liquid nitrogen temperature (77K). The results are shown in Table 1. As shown in Table 1, it is understood that a multi-wavelength infrared detector which is reduced in a difference in sensitivity along with a difference in wavelength and has high sensitivity close to that of a single-wavelength device can be obtained. Also, the pitch of pixels was 30 μm which was the same as that of a single wavelength infrared detector.

| (Average value) | Single-wavelength device | Present invention |
|---|---|---|
| 10 μm band sensitivity (cmHz$^{1/2}$/W) | 2.5 × 10$^{10}$ | 2.3 × 10$^{10}$ |
| -continued | | |
| (Average value) | Single-wavelength device | Present invention |
| 3–5 μm band sensitivity (cmHz$^{1/2}$/W) | 8.5 × 10$^{10}$ | 7.7 × 10$^{10}$ |

Figure 6:
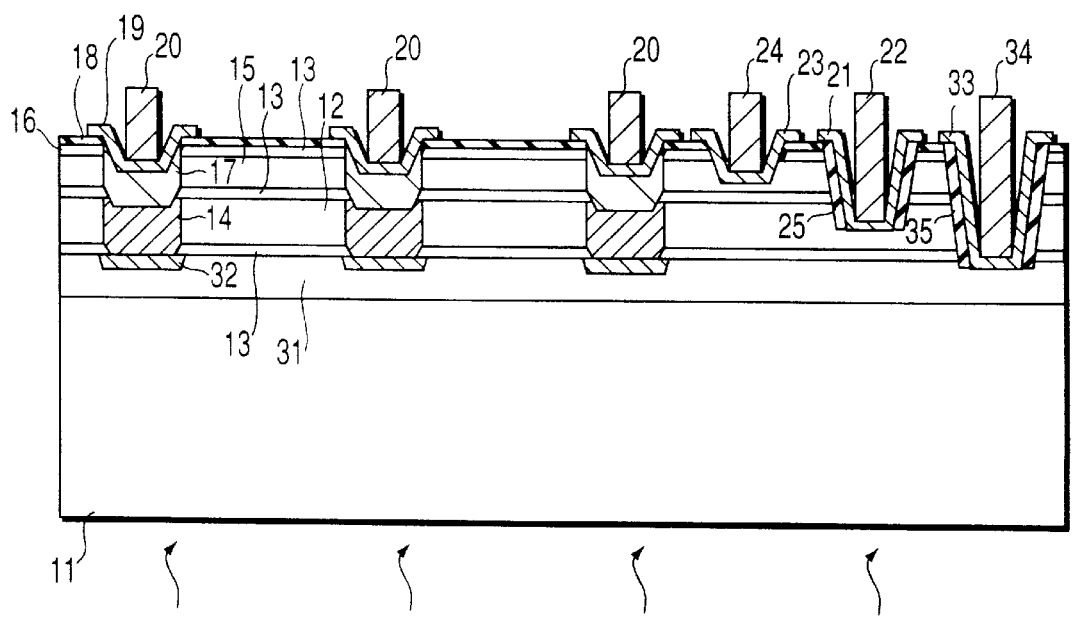
FIG. 6 is sectional view of a multi-wavelength semiconductor image sensor according to a second embodiment of the present invention.

FIG. 6 shows a three wavelength infrared detector according to a second embodiment of the present invention. The same parts as in the above first embodiment are represented by the same symbols and only different parts will be explained.

A p-type $Hg_{0.2}Cd_{0.8}Te$ photo-absorbing layer 31 is formed on a substrate 11 of single crystal CdZnTe (Zn:3%). A CdTe isolation layer 13 about 2 μm in thickness is grown on the p-type $Hg_{0.2}Cd_{0.8}Te$ photo-absorbing layer 31. Also, an n$^+$ region 32 of $Hg_{0.2}Cd_{0.8}Te$ is formed in the p-type $Hg_{0.2}Cd_{0.8}Te$ photo-absorbing layer 31. The structure above the n$^+$ region 32 is the same as that of the first embodiment. An indium interconnecting bump 34 is provided on the p-type $Hg_{0.2}Cd_{0.8}Te$ photo-absorbing layer 31 through a ground electrode 33. The ground electrode 33 is insulated from the photo-absorbing layers 12 and 15 by an insulation film 35.

The p-type $Hg_{0.2}Cd_{0.8}Te$ photo-absorbing layer 31 in this embodiment is formed in the same growth condition as in the first embodiment. Specifically, metal mercury, dimethyl cadmium and diisopropyl telluride are used as source gas and the growth temperature is designed to be, for example, 360° C. The n$^+$ region 32 of $Hg_{0.2}Cd_{0.8}Te$ is formed by diffusion of or ion implantation with a donor impurity.

Figure 7:
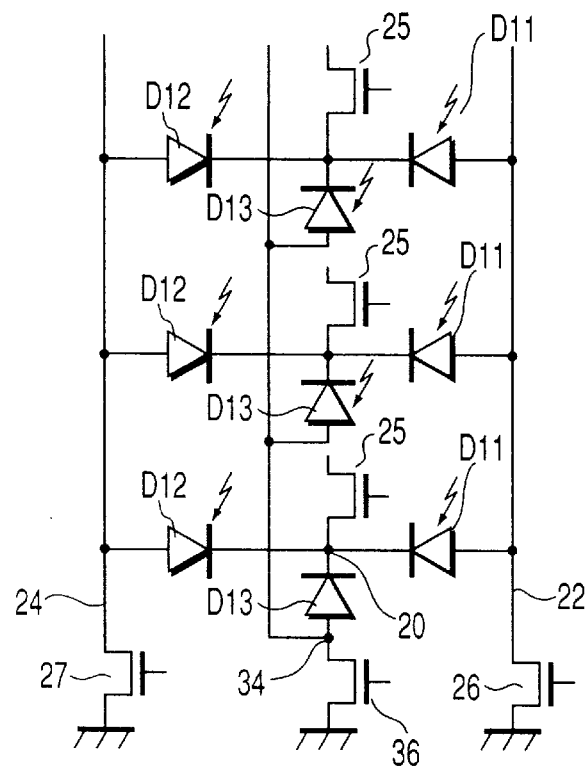
FIG. 7 is an equivalent circuit diagram of the multi-wavelength semiconductor image sensor according to the second embodiment of the present invention.

FIG. 7 shows an equivalent circuit of FIG. 6. The same parts as in FIG. 4 are represented by the same symbols. The p-type $Hg_{0.2}Cd_{0.8}Te$ photo-absorbing layer 31 and the n$^+$ region 32 of $Hg_{0.2}Cd_{0.8}Te$ form a photodiode D13. Each cathode of these photodiodes are connected in common to the photodiodes D11 and D12 and each anode is connected in common to the ground electrode 33 and the interconnecting bump 34. The interconnecting bump 34 is grounded via a switching element 36. An output signal from the photodiode D13 is selectively drawn by turning on the switching elements 36 and 25 and transferred to a charge transfer device.

The photodiode characteristics of each pixel was measured in the same manner as in the first embodiment. As a result, it was confirmed that a highly sensitive multi-wavelength infrared detector which was reduced in a difference in sensitivity along with a difference in wavelength was obtained like the first embodiment.

Figure 8:
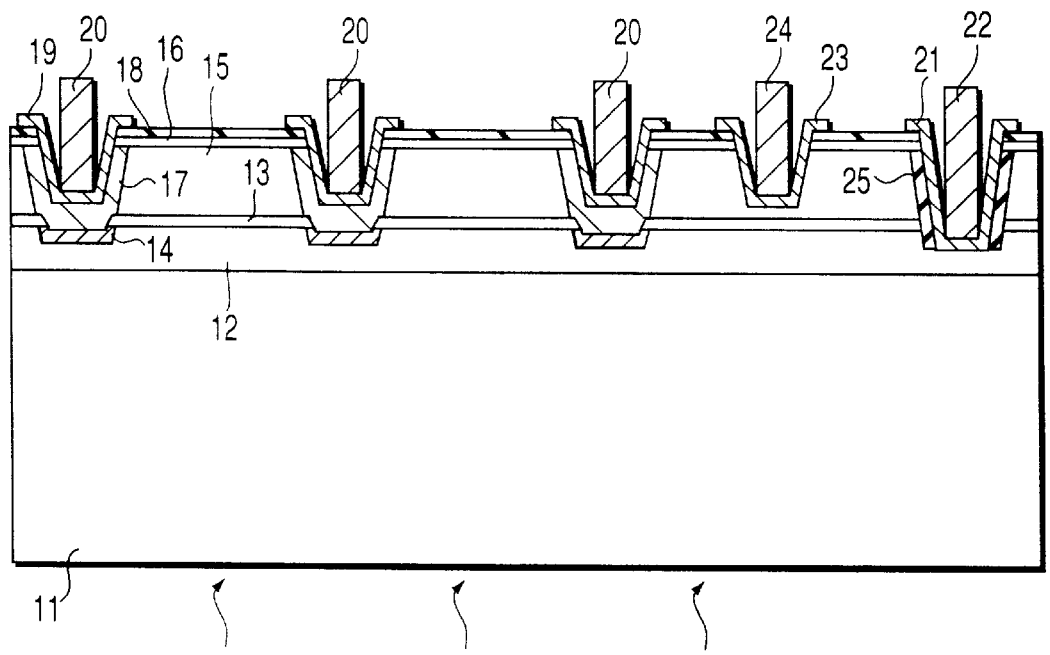
FIG. 8 is sectional view of a multi-wavelength semiconductor image sensor according to a third embodiment of the present invention.

FIG. 8 shows a third embodiment of the present invention. This embodiment relates to a two wavelength infrared image sensor with a manufacturing step simpler than that of the first embodiment. Specifically, in the third embodiment, the n$^+$ regions 14 and 17 are formed at the same time, making the manufacturing step simpler.

Figure 9A:
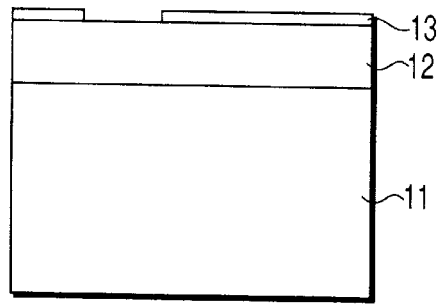
FIGS. 9A, 9B and 9C are sectional views of a device structure in the step of manufacturing the multi-wavelength semiconductor image sensor shown in FIG. 8.

The manufacturing method of the third embodiment will be explained with reference to FIGS. 9A, 9B and 9C. Like in the first embodiment, as shown in FIG. 9A, a p-type $Hg_{0.7}Cd_{0.3}Te$ photo-absorbing layer 12 about 10 μm in thickness is grown on a substrate 11 of single crystal CdznTe (Zn:3%) by a chemical vapor growth method using an organic compound as raw material. As for the growth condition, metal mercury, dimethyl cadmium and diisopropyl telluride are used as raw gas and the growth temperature is designed to be, for example, 360° C. In succession, a CdTe isolation layer 13 about 2 μm in thickness is formed on the p-type $Hg_{0.7}Cd_{0.3}Te$ photo-absorbing layer 12 at a growth temperature of 320° C. The photo-absorbing layer 12 and the isolation layer 13 are removed in a square shape with a side length of 10 μm by etching to a depth of about 3 μm from the surface of the CdTe isolation layer 13 to the photo-absorbing layer 12 according to a photography technique.

Figure 9B:
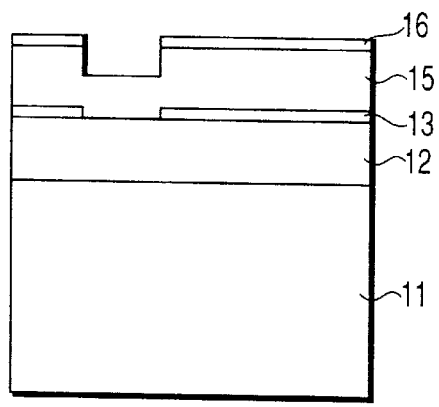
Figure 9C:
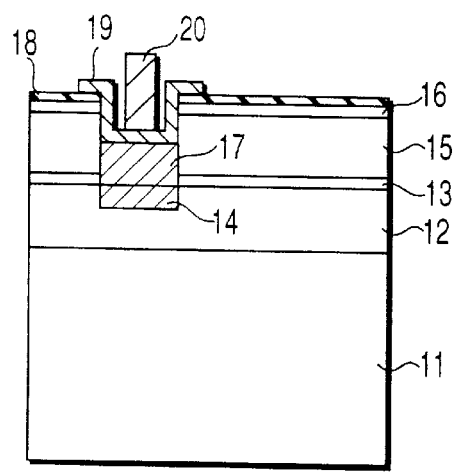

Next, as shown in FIG. 9B, the supply amount of raw material is changed to deposit a p-type $Hg_{0.77}Cd_{0.23}Te$ photo-absorbing layer 15 about 10 μm in thickness on the isolation layer 13 and the photo-absorbing layer 12 at a growth temperature of 360° C. by using metal mercury, dimethyl cadmium and diisopropyl telluride. In this case, the growth temperature is designed to be 320° C. at the start of growth and then raised up to 360° C. in about two minutes. Like in the first embodiment, this operation can prevent the dissociation of mercury from the $n^+$ region 14 of $Hg_{0.7}Cd_{0.3}Te$ and the p-type $Hg_{0.7}Cd_{0.3}Te$ photo-absorbing layer 12. In succession, a CdTe passivation layer 16 about 1 μm in thickness is likewise deposited on the photo-absorbing layer 15 at a growth temperature of 320° C. Next, using a photolithography technique, the passivation layer 16 and the photo-absorbing layer 15 are removed in a square shape with a side length of 10 μm by etching to a depth of about 6 μm from the surface of the passivation layer 16 to the photo-absorbing layer 15. Then, a donor impurity is introduced into the photo-absorbing layers 12 and 15 by using a diffusion method or ion implantation method to form $n^+$ regions 14, 17 of $Hg_{0.77}Cd_{0.23}Te$ as shown in FIG. 9C.

After that, the zinc sulfide thin film with a thickness of 300 nm is laminated as a passivation layer on the passivation layer 16. Thereafter, an indium electrode 19 is formed in each $n^+$ region 17 and ground electrodes 21 and 23 common to the photo-absorbing layers 12 and 15 with each different wavelength are formed on the periphery of a sensor array.

Moreover, an indium interconnecting bump 20 is formed on each electrode 19 of all elements and indium interconnecting bumps 22 and 24 are formed on the common ground electrodes 21 and 23 with each different wavelengths respectively. A charge transfer device is electrically connected to these interconnecting bumps 20, 22 and 24 so as to select the wavelength and each pixel.

The above production method involves only one step for introducing an impurity to form the $n^+$ regions 14 and 17 and hence prevents positional slippage in the photolithographic step, enabling it to restrain a variation in the sensitivity between detectors.

As stated above, in the present invention, semiconductor layers with different forbidden gaps and isolation layers interposed between these semiconductor layers are formed by depositing these layers step by step. The formation of a laminated structure by depositing plural semiconductor layers provided with pn junctions step by step has been known in the semiconductor technologies. In photodetector devices, especially, infrared photodetector devices including mercury as raw material, mercury tends to be dissociated from the surface of a base semiconductor device by heating for epitaxial deposition. This affords opportunity for breakdown of semiconductor devices and hence it is difficult to laminate all semiconductor layers successively. In the present invention, however, as explained in the first to third embodiments, in the case of laminating semiconductor layers successively, the growth temperature is designed to be 320° C. at the start of growth and is raised to 360° C. in about two minutes to succeed in preventing dissociation of mercury, thereby making it possible to grow such a laminated structure as in the present invention.

A interconnecting bump required for the electrical connection of each pixel is only one in number per pixel, thereby reducing an area occupied by one pixel and enabling high integration. Further, the present invention can simplify a manufacturing method and produce a high quality multi-wavelength semiconductor image sensor with ease.

The present invention is not limited to the aforementioned embodiments. For instance, the first and second conductive type semiconductor photo-absorbing layers may be an HgznTe photo-absorbing layer as the semiconductor compound including at least mercury.

As stated above, the present invention can provide a multi-wavelength semiconductor image sensor which ensures high density integration and allows the production method to be simplified. The present invention also provides a method for manufacturing the image sensor.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi-wavelength semiconductor image sensor including a plurality of pixels, comprising:
   a plurality of photo-absorbing layers which differ in forbidden gap and are laminated on a substrate, the photo-absorbing layers formed of a first conductivity type semiconductor;
   at least one semiconductor isolation layer interposed between the photo-absorbing layers, the isolation layer having openings at positions of the pixels;
   a plurality of semiconductor regions each formed continuously in the photo-absorbing layers through each of the openings at the positions of the pixels and formed of a second conductivity type semiconductor, each of the semiconductor regions being formed of a first portion formed just below one of the openings and in one of the photo-absorbing layers and a second portion formed just below the first portion and in the other of the photo-absorbing layers and separated from the substrate;
   a plurality of electrodes connected to the semiconductor regions, respectively; and
   a plurality of ground electrodes connected respectively to the photo-absorbing layers.

2. A multi-wavelength semiconductor image sensor according to claim 1, wherein the semiconductor isolation layer is formed of a semiconductor layer with a forbidden gap larger than that of each of the photo-absorbing layers.

3. A multi-wavelength semiconductor image sensor according to claim 1, wherein each of the semiconductor portions has a concave surface.

4. A multi-wavelength semiconductor image sensor according to claim 1, wherein each of the photo-absorbing layers is formed of a compound semiconductor including at least mercury.

5. A multi-wavelength semiconductor image sensor according to claim 4, wherein the photo-absorbing layers have forbidden gaps becoming narrower in order in the direction of incidence of infrared introduced from the substrate.

6. A multi-wavelength semiconductor image sensor according to claim 4, wherein the photo-absorbing layers are first and second photo-absorbing layers formed of a p-type $Hg_{0.7}Cd_{0.3}Te$ photo-absorbing layer and a p-type $Hg_{0.77}Cd_{0.23}Te$ photo-absorbing layer, respectively.

7. A multi-wavelength semiconductor image sensor including a plurality of pixels, comprising:

a first photo-absorbing layer with a first forbidden gap which is formed on a substrate, the first photo-absorbing layer being formed of a first conductivity type semiconductor;

a semiconductor isolation layer deposited on the first photo-absorbing layer, the isolation layer having openings at positions of the pixels;

a second photo-absorbing layer with a second forbidden gap differing from the first forbidden gap, the second semiconductor photo-absorbing layer being deposited on the semiconductor isolation layer and formed of the first conductivity type semiconductor;

a plurality of semiconductor regions formed continuously in the first and second photo-absorbing layers through the openings at the positions of the pixels, respectively, and formed of a second conductivity type semiconductor, each of the semiconductor regions including a first semiconductor portion on the first photo-absorbing layer and a second semiconductor portion formed just below one of the openings and laminated on the first semiconductor portion in the second photo-absorbing layer;

a plurality of output electrodes connected to the semiconductor regions, respectively; and first and second ground electrodes connected to the first and second photo-absorbing layers, respectively.

8. A multi-wavelength semiconductor image sensor according to claim 7, wherein the semiconductor isolation layer is formed of a semiconductor layer with a forbidden gap larger than each of the first and second photo-absorbing layers.

9. A multi-wavelength semiconductor image sensor according to claim 7, wherein each of the first and second semiconductor portions has a concave surface.

10. A multi-wavelength semiconductor image sensor according to claim 7, wherein each of the first and second photo-absorbing layers is formed of a compound semiconductor including at least mercury.

11. A multi-wavelength semiconductor image sensor according to claim 7, wherein the first forbidden gap of the first photo-absorbing layer on the side of the substrate into which infrared are introduced is wider than the second forbidden gap of the second photo-absorbing layer.

* * * * *